(12) United States Patent
Afzalian

(10) Patent No.: US 11,264,452 B2
(45) Date of Patent: Mar. 1, 2022

(54) HETERO-TUNNEL FIELD-EFFECT TRANSISTOR (TFET) HAVING A TUNNEL BARRIER FORMED DIRECTLY ABOVE CHANNEL REGION, DIRECTLY BELOW FIRST SOURCE/DRAIN REGION AND ADJACENT GATE ELECTRODE

(71) Applicant: TAIWAN SEMICONDUCTOR MANUFACTURING COMPANY, LTD., Hsin-Chu (TW)

(72) Inventor: Aryan Afzalian, Chastre (BE)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 0 days.

(21) Appl. No.: 14/982,501

(22) Filed: Dec. 29, 2015

(65) Prior Publication Data
US 2017/0186839 A1   Jun. 29, 2017

(51) Int. Cl.
| *H01L 29/78* | (2006.01) |
| *H01L 29/06* | (2006.01) |
| *H01L 29/10* | (2006.01) |
| *H01L 29/775* | (2006.01) |
| *H01L 29/66* | (2006.01) |
| *H01L 29/205* | (2006.01) |
| *H01L 29/201* | (2006.01) |
| *H01L 29/207* | (2006.01) |

(52) U.S. Cl.
CPC ...... *H01L 29/0638* (2013.01); *H01L 29/1054* (2013.01); *H01L 29/201* (2013.01); *H01L 29/205* (2013.01); *H01L 29/207* (2013.01); *H01L 29/66522* (2013.01); *H01L 29/66659* (2013.01); *H01L 29/66795* (2013.01); *H01L 29/775* (2013.01); *H01L 29/78* (2013.01); *H01L 29/785* (2013.01); *H01L 29/7827* (2013.01); *H01L 29/66666* (2013.01)

(58) Field of Classification Search
CPC ............... H01L 29/7311; H01L 29/737; H01L 29/7376; H01L 29/0638; H01L 29/66793; H01L 29/785
See application file for complete search history.

(56) References Cited

U.S. PATENT DOCUMENTS

| 6,538,275 B2 * | 3/2003 | Sugiyama ......... H01L 21/28273 257/314 |
| 7,531,389 B2 * | 5/2009 | Ikuta ................. H01L 29/66363 438/113 |
| 7,667,271 B2 | 2/2010 | Yu et al. |
| 8,362,575 B2 | 1/2013 | Kwok et al. |
| 8,367,498 B2 | 2/2013 | Chang et al. |

(Continued)

OTHER PUBLICATIONS

Thyristors. Chris Woodford. Dec. 24, 2018.*

(Continued)

*Primary Examiner* — Anh D Mai
(74) *Attorney, Agent, or Firm* — Haynes and Boone, LLP

(57) ABSTRACT

A transistor device includes a channel, a first source/drain region positioned on a first side of the channel, a second source/drain region positioned on a second side of the channel opposite the first side of the channel, and a tunnel barrier disposed between the channel and the first source/drain region, the tunnel barrier adapted to suppress band-to-band tunneling while the transistor device is in an off state.

20 Claims, 14 Drawing Sheets

(56) References Cited

U.S. PATENT DOCUMENTS

| | | | |
|---|---|---|---|
| 8,440,517 B2 | 5/2013 | Lin et al. | |
| 8,497,528 B2 | 7/2013 | Lee et al. | |
| 8,610,240 B2 | 12/2013 | Lee et al. | |
| 8,680,576 B2 | 3/2014 | Ching et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,785,285 B2 | 7/2014 | Tsai et al. | |
| 8,796,759 B2 | 8/2014 | Perng et al. | |
| 8,809,139 B2 | 8/2014 | Huang et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,890,118 B2 * | 11/2014 | Chu-Kung | H01L 29/0843 257/24 |
| 9,236,435 B2 * | 1/2016 | Zhang | H01L 29/7391 |
| 2011/0068407 A1 | 3/2011 | Yeh et al. | |
| 2011/0215425 A1 * | 9/2011 | Loh | H01L 29/78 257/410 |
| 2013/0011983 A1 | 1/2013 | Tsai et al. | |
| 2013/0119395 A1 * | 5/2013 | Bhuwalka | H01L 29/7391 257/76 |
| 2014/0015009 A1 * | 1/2014 | Le Royer | H01L 29/66477 257/192 |
| 2014/0252412 A1 | 9/2014 | Tsai et al. | |
| 2016/0071965 A1 * | 3/2016 | Afzalian | H01L 29/165 257/12 |
| 2016/0104769 A1 * | 4/2016 | Verreck | H01L 29/0847 257/9 |

OTHER PUBLICATIONS

"Thyristor; From Wikipedia, the free encyclopedia," published Feb. 13, 2013, printed from https://web.archive.org/web/20130213122653/https:/en.wikipedia.org/wiki/Thyristor on Nov. 20, 2018, pp. 1-8, date unknown.

"Electronic Devices: Systems & Applications" printed on Nov. 20, 2018, from https://books.google.com/books?id=Bs6sz1TlfalC&printsec=frontcover#v=onepage&g&f=false. pp. 278-279 (Chapter 6—Field-Effect Transistors and Circuits), and 465-467 (Chapter 11—Thyristor).

* cited by examiner

HETERO-TUNNEL FIELD-EFFECT TRANSISTOR (TFET) HAVING A TUNNEL BARRIER FORMED DIRECTLY ABOVE CHANNEL REGION, DIRECTLY BELOW FIRST SOURCE/DRAIN REGION AND ADJACENT GATE ELECTRODE

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

A common device within integrated circuits is a transistor. A typical transistor either allows or prohibits electric current from flowing between the source terminal and the drain terminal based on both the voltage applied at the gate and the type of transistor. Specifically, while transistor is in an on state, current is allowed to flow between the source terminal and the drain terminal. While the transistor is in an off state, current is prohibited from flowing between the source terminal and the drain terminal. Typically, even in the off state, current may leak through the transistor device. It is desirable to reduce this leakage current as much as possible.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
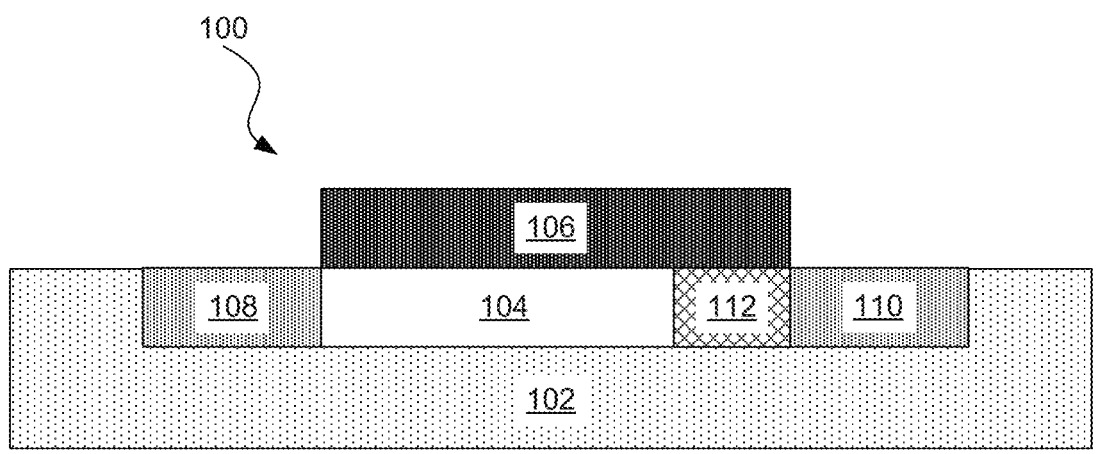
FIG. 1 is a diagram showing an illustrative transistor device with a tunnel barrier, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, it is desirable to reduce the amount of leakage current of a transistor device in the off state. Leakage current may result from a variety of factors, including band-to-band tunneling, resonant tunneling, and direct source to drain tunneling. According to principles described herein, a tunnel barrier is placed between the channel and the source and drain region. The tunnel barrier may have various characteristics that suppress leakage current while having a minimal effect on the on-state current. In one example, the tunnel barrier exhibits a lower valence band than that of the channel, thus increasing the bandgap between the valence band and the conduction band within the tunnel barrier. The bandgap of the tunnel barrier may be made different than that of the channel by having a different material. In some cases, the tunnel barrier may also be doped differently than the channel and the source or drain.

FIG. 1 is a diagram showing an illustrative transistor device 100 with a tunnel barrier 112. According to the present example, the transistor device 100 is formed into a substrate 102. The transistor device 100 includes a gate 106, channel 104, a first source/drain region 108, a second source/drain region 110, and the tunnel barrier 112.

The substrate 102 may be a semiconductor substrate, such as a silicon substrate. In some cases, the substrate may be doped based on the type of transistors being formed thereon. For example, for N-type transistors, the substrate 102 may be doped with the P-type dopant. For P-type transistors, the substrate 102 may be doped with an N-type dopant.

The first source/drain region 108 and the second source/drain region 110 may be highly doped regions. In the case of an N-type transistor, the first source/drain region 108 and the second source/drain region 110 may be doped with an N-type dopant. In the case of a P-type transistor, the first source/drain region 108 and the second source/drain region 110 may be doped with a P-type dopant. Both the first source/drain region 108 and the second source/drain region 110 may be connected to a conductive contact (not shown). Through such contacts, electric current can pass through the transistor between the first source/drain region 108 and the second source/drain region 110.

The gate 106 may be made of a conductive material such as a metal or poly silicon. The gate 106 may include a gate stack, which includes multiple layers of various materials. For example, the gate stack may include a high-k dielectric layer and a variety of metal layers. The gate 106 may also be connected to a contact. The voltage level applied to the gate 106 through its contact may determine whether the transistor device 100 is an off state or an on state.

The channel 104 may include a semiconductor material such as silicon. In some cases, the channel 104 may include a high-mobility semiconductor material. A high-mobility material is a material that has a higher mobility than that of silicon. High-mobility materials include silicon germanium (SiGe), indium arsenide (InAs), or indium antimonide (InSb). Because such high-mobility semiconductor materials have a smaller bandgap between the conduction band and the valence band, such materials may exhibit more leakage current, even though such materials may provide better on-state performance.

In the present example, the tunnel barrier 112 is positioned between the channel and the second source/drain region 110. The tunnel barrier 112 may have characteristics that suppress leakage current in the off state. In one example, the conduction band and valence band of the tunnel barrier 112 may have different energy levels than the conduction band and valence band of the channel. In some examples, the tunnel barrier may have a larger bandgap than the channel. In one example, as will be described in further detail below, the tunnel barrier 112 may have a lower valence band than the channel. In one example, as will be described in further detail below, the tunnel barrier 112 may have a higher conduction band than the channel. In some examples, the larger bandgap of the tunnel barrier 112 may result from the type of material used to form the tunnel barrier 112. For example, the tunnel barrier may be made of silicon germanium and the channel 104 may be made of silicon. In one example, the tunnel barrier 112 may be made of indium arsenic antimonide (InAsSb) and the channel 104 may be made of indium antimonide (InSb). In one example, the tunnel barrier 112 may be made of indium gallium arsenide (InGaAs) and the channel 104 may be made of indium arsenide (InAs). In one example, the tunnel barrier 112 may be made of indium phosphorous and the channel 104 may be made of silicon. In one example, the tunnel barrier 112 may be made of germanium and the channel 104 may be made of silicon. In one example, the tunnel barrier 112 may be made of indium antimony and the channel 104 may be made of indium arsenide. Other combinations of materials that cause the tunnel barrier 112 to have a larger bandgap than the channel are contemplated.

In the present example, the tunnel barrier 112 is positioned beneath the gate 106 such that the edge of the tunnel barrier 112 is substantially aligned with the edge of the gate 106. In some examples, however, the tunnel barrier 112 may extend beyond the gate 106. In some examples, the gate 106 may extend beyond the tunnel barrier 112.

The tunnel barrier 112 may be tuned in other ways to further affect the conduction band and the valence band with respect to those of the channel 104. In some examples, the tunnel barrier 112 may have a higher effective mass than that of the channel. This may be achieved through various mechanisms. For example, a proper strain effect (through epitaxial growth of a different semiconductor material) may change the effective mass. In some examples, the material used for the tunnel barrier may have a higher effective mass than the material used for the channel. A change in effective mass can be used in combination with the changes in conduction band and valence band energy levels. In some examples the tunnel barrier 112 may have a different shape compared to that of the channel 104. For example, the tunnel barrier 112 may be larger than or smaller than a transverse dimension of the channel 104.

In some examples, the thickness of the tunnel barrier 112 may be tuned to affect the conduction band and the valence band of the tunnel barrier 112 with respect to the conduction band and valence band of the channel 104. For example, the thickness of the tunnel barrier 112 may be set to a length that minimizes leakage current while also minimizing the effect on the on state current. In one example, the tunnel barrier may have a thickness within a range of about 2 to 7 nm. Other sizes the tunnel barrier 112 are contemplated as well.

In other examples, the tunnel barrier 112 may be made of the same semiconductor material as the channel, but with heavy doping applied to shift the bandgap of the tunnel barrier 112. In the case of an N-type transistor, the tunnel barrier 112 may be highly doped with an N-type dopant. For example, the tunnel barrier 112 may have a doping concentration greater than $10^{19}$ cm$^3$ and the channel 104 may have a doping concentration that is less than $10^{17}$ cm$^3$. The doping concentration of the tunnel barrier 112 may also be higher than the doping concentration of the adjacent source/drain region 110. By doping the tunnel barrier 112 with a higher doping concentration, the valence band of the tunnel barrier 112 can be moved to a lower energy level with respect to the energy level of the channel's 104 valence band.

In the case of a P-type transistor, the tunnel barrier 112 may be highly doped with a P-type dopant. For example, the tunnel barrier 112 may have a doping concentration greater than $5 \times 10^{18}$ cm$^3$ and the channel 104 may have a doping concentration that is less than $10^{17}$ cm$^3$. In some examples, the tunnel barrier 112 may be doped with a doping concentration within the range of about $5 \times 10^{18}$ cm$^3$ to $10^{21}$ cm$^3$. The doping concentration of the tunnel barrier 112 may also be higher than the doping concentration of the adjacent source/drain region 110. By doping the tunnel barrier 112 with a higher doping concentration, the conduction band of the tunnel barrier 112 can be moved to a higher energy level with respect to the energy level of the channel's 104 conduction band.

Figure 2A:
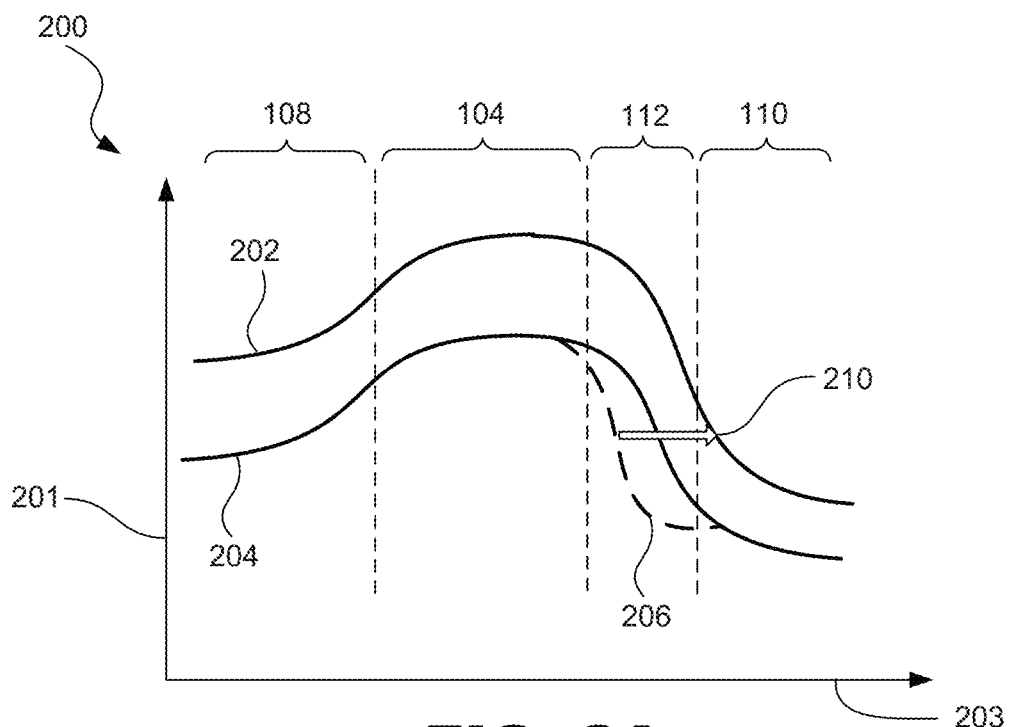
FIG. 2A is a graph showing an illustrative off-state bandgap in a transistor device having a tunnel barrier, according to one example of principles described herein.

FIG. 2A is a graph showing an illustrative off-state bandgap in an NMOS transistor device having a tunnel barrier. According to the present example, the graph 200 shows the conduction band 202 and the valence band 204 of a transistor device (e.g., 100, FIG. 1). The conduction band 202 is the lowest range of vacant electron states. The valence band is the highest range of electron energies in which electrons are normally present. The horizontal axis 203 of the graph 200 represents position across the first source/drain region 108, the channel 104, the tunnel barrier 112, and the second source/drain region 110. The vertical axis 201 of the graph 200 represents energy levels.

In the present example, the tunnel barrier 112 is such that it lowers the valence band 204 within the region corresponding to the tunnel barrier 112. In other words, the tunnel barrier causes a depression 206 in the energy level of the valence band 204 compared to what the energy level of the valence band 204 would be without the tunnel barrier 112. In some examples, the depression 206 may lower the energy level of the valence band 204 by a range of about 0.1-0.3 electron volts. For example, the depression 206 may lower the energy level of the valence band 204 by about 0.2 electron volts. The solid line representing the valence band 204 indicates the energy level of the valence band 204 as if there were no tunnel barrier 112. The dotted line showing the depression 206 represents the energy level of the valence band 204 as a result of the tunnel barrier 112 being present. The depression 206 in the valence band 204 increases the gap between the valence band 204 and the conduction band 202 within the region corresponding to the tunnel barrier 112. This increased bandgap causes a reduction in any leakage current 210 passing from the valence band 204 to the conduction band 202. Such leakages typically referred to as band-to-band tunneling.

Figure 2B:
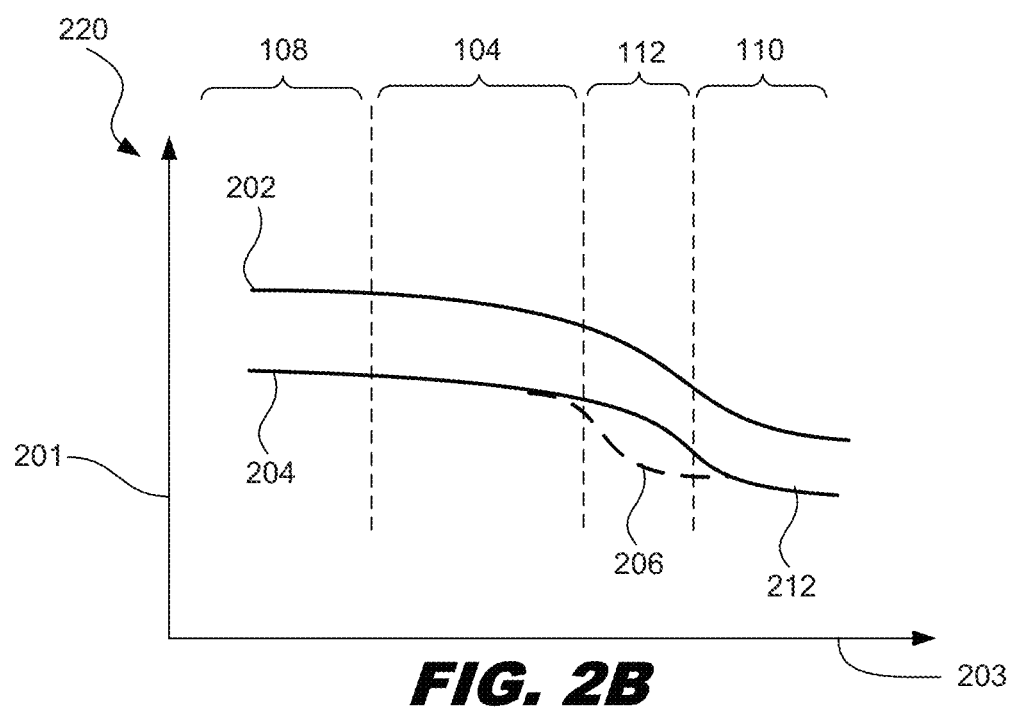
FIG. 2B is a graph showing an illustrative on-state bandgap in a transistor device having a tunnel barrier, according to one example of principles described herein.

FIG. 2B is a graph 220 showing an illustrative on-state bandgap in a transistor device having a tunnel barrier 112. Application of voltage to the gate (e.g. 106, FIG. 1) lowers the energy levels of both the conduction band 202 and the valence band 204 within the channel 104. This allows electrons to more easily pass from the first source/drain region 108 to the second source/drain region 110 through the channel 104, thus producing electric current through the transistor device. In the present example, with the tunnel barrier 112 present, the conduction band 202 remains substantially the same. Thus, the on-state current can flow through the channel as normal in the conduction band. The valence band 204, however, still has a depression 206 in the region corresponding to the tunnel barrier 112. Because current flows in the conduction band for an NMOS transistor, the on-state current is minimally affected by the change in the valence band 204. But, the off-state band-to-band tunneling current is substantially reduced.

Figure 3A:
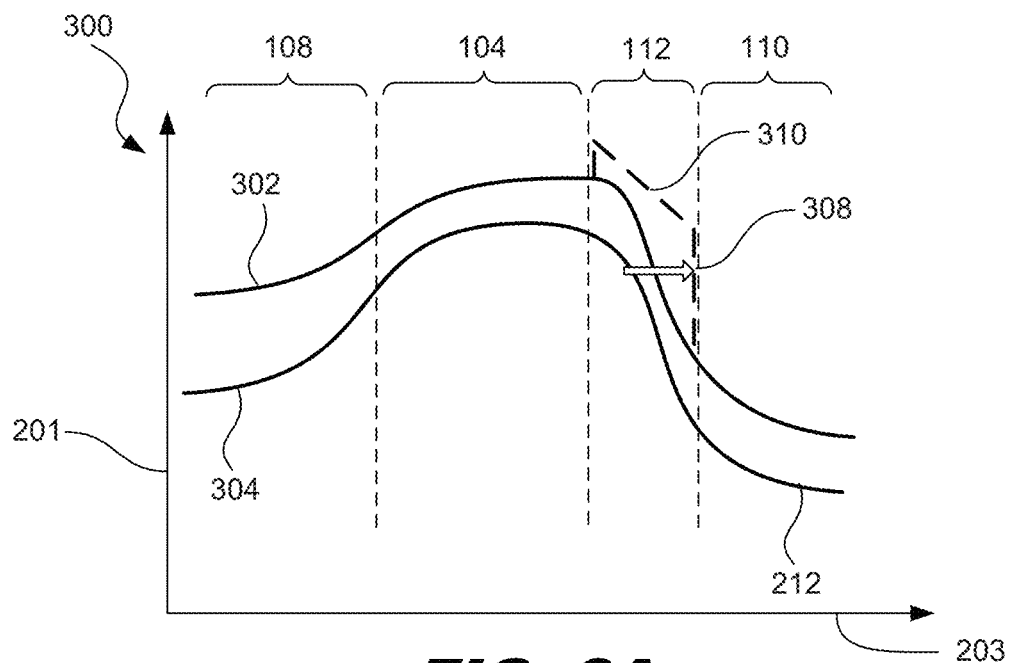
FIG. 3A is a graph showing an illustrative off-state bandgap in a transistor device having a tunnel barrier, according to one example of principles described herein.

FIG. 3A is a graph 300 showing an illustrative off-state bandgap in an NMOS transistor device having a tunnel barrier. According to the present example, the graph 300 shows the conduction band 302 and the valence band 304 of a transistor device (e.g., 100, FIG. 1). The horizontal axis 203 of the graph 200 represents position across the first source/drain region 108, the channel 104, the tunnel barrier 112, and the second source/drain region 110. The vertical axis 201 of the graph 200 represents energy levels.

In the present example, the tunnel barrier 112 such that it causes a bump 310 in the conduction band 302 to the region corresponding to the tunnel barrier 112. In other words, the conduction band 302 has a raised energy level due to the characteristics of the tunnel barrier 112. In some examples, the bump 310 may raise the energy level of the conduction band 302 by a range of about 0.1-0.3 electron volts. For example, the bump 310 may raise the energy level of the conduction band 302 by about 0.2 electron volts. The solid line representing the conduction band 302 indicates the energy level of the conduction band 302 as if there were no tunnel barrier 112. The dotted line showing the bump 310 represents the energy level of the conduction band 302 as a result of the tunnel barrier 112 being present. The bump 310 in the conduction band 302 increases the gap between the valence band 304 and the conduction band 302 within the region corresponding to the tunnel barrier 112. This increased bandgap causes a reduction in any leakage current 308 passing from the valence band 304 to the conduction band 302. Such leakages typically referred to as band-to-band tunneling.

Figure 3B:
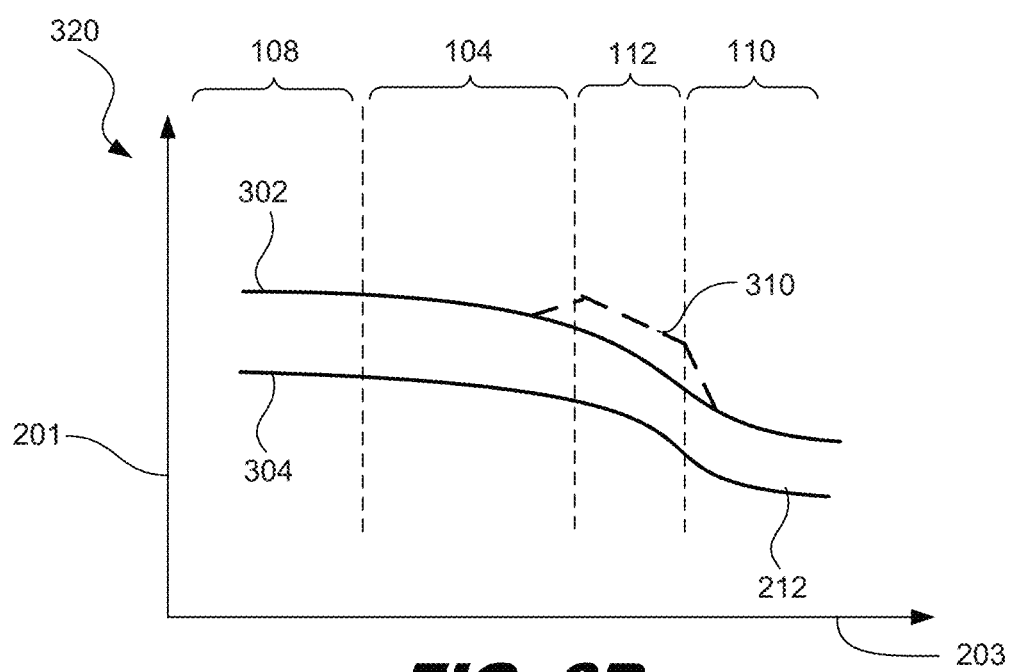
FIG. 3B is a graph showing an illustrative on-state bandgap in a transistor device having a tunnel barrier, according to one example of principles described herein.

FIG. 3B is a graph 320 showing an illustrative on-state bandgap in a transistor device having a tunnel barrier. Application of voltage to the gate (e.g. 106, FIG. 1) lowers the energy levels of both the conduction band 302 and the valence band 304 within the channel 104. This allows electrons to more easily pass from the first source/drain region 108 to the second source/drain region 110 through the channel 104, thus producing electric current through the transistor device. In the present example, with the tunnel barrier 112 present, while the conduction band 202 still includes the bump 310, the size of the bump 310 may have a negligible effect on the on state current. In other words, the bump 310 may substantially reduce band-to-band tunneling while having a minimal effect on the on-state current. In some examples, the position of the tunnel barrier with respect to the edge of the gate may also help limit the band-to-band tunneling and/or minimize the impact on the on-current. Specifically, as illustrated in FIG. 1, the gate 106 completely overlaps the tunnel barrier 112.

Figure 4A:
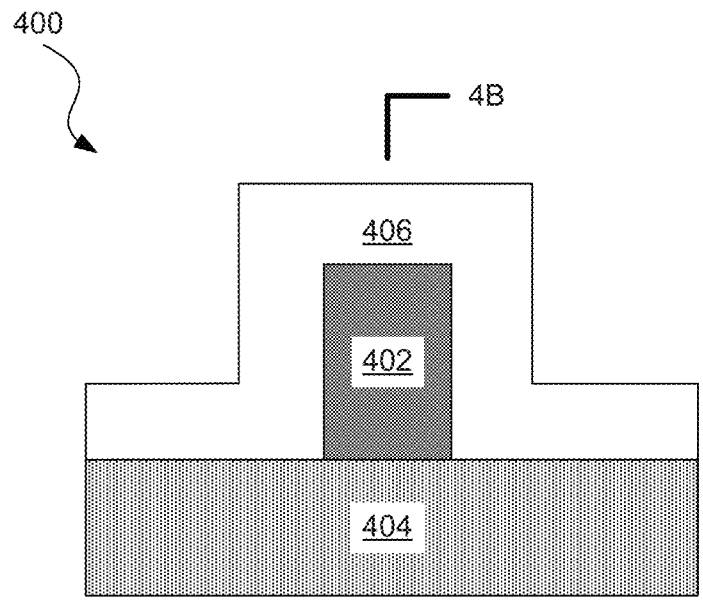
FIGS. 4A and 4B are diagrams showing illustrative fin structure transistor device with the tunnel barrier, according to one example of principles described herein.
Figure 4B:
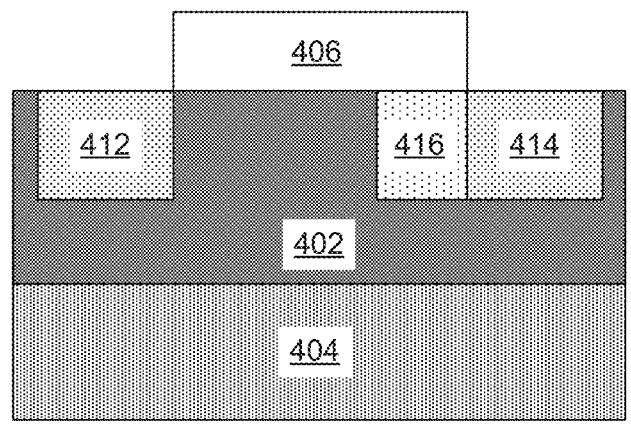

FIGS. 4A and 4B are diagrams showing illustrative fin structure transistor device 400 with a tunnel barrier 416. FIG. 4A is a cross-sectional view perpendicular to the fin structure 402. The fin structure be formed using a variety of fabrication processes. The fin structure 402 is an elongated protuberance from the substrate 404. The fin structure for two is made of a semiconductor material, and as will be explained in further detail below, can be doped to form source and drain regions. Gate layer 406 is formed over the fin structure 402. Typically, the gate layer 406 runs perpendicular to the fin structure 402. Additionally, the gate layer 406 wraps around the fin structure 402 such that the gate layer 406 is positioned in three different sides of the fin structure 402.

FIG. 4B is a cross-sectional view that is parallel to the fin structure 402. FIG. 4B illustrates a first source/drain region 412 and a second source/drain region 414. The source/drain regions 412, 414 may be formed in a variety of manners. In one example, the source/drain regions 412, 414 are formed by doping the fin structure for two in the appropriate regions. In one example, the source/drain regions 412, 414 are formed by etching trenches into the fin structures an epitaxial growing the source/drain regions 412, 414. The fin structure transistor device 400 also includes a tunnel barrier 416. The tunnel barrier 416 exhibits characteristics that affect the energy levels of the conduction band and valence band within the tunnel barrier 415 with respect to that of the channel.

Figure 5:
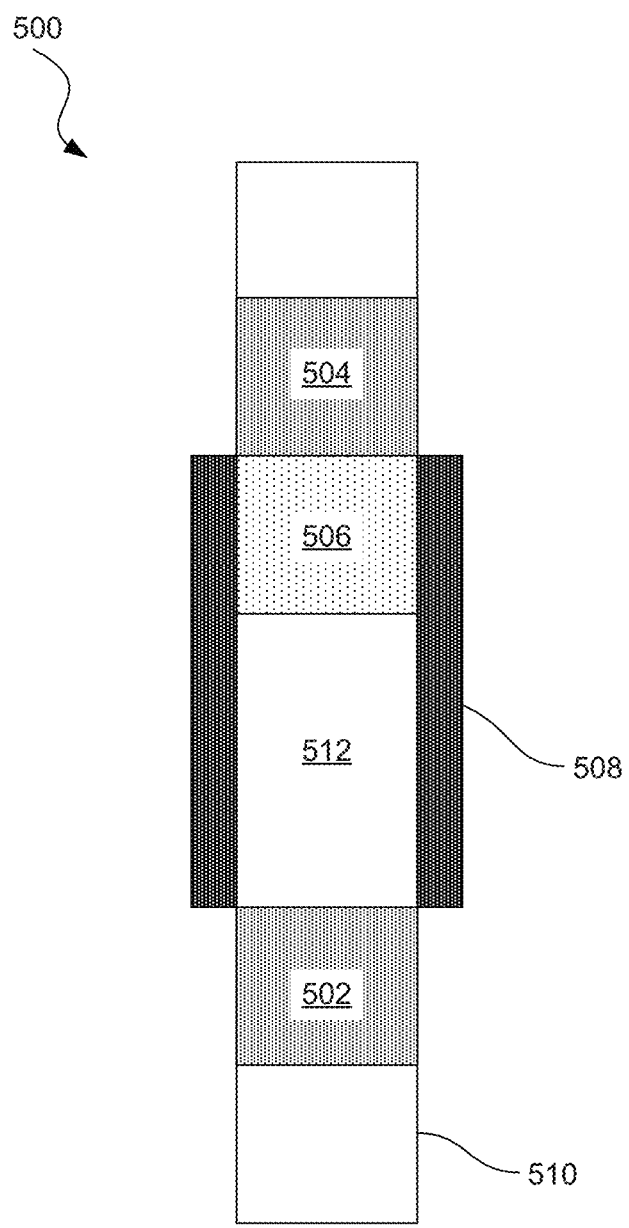
FIG. 5 is a diagram showing an illustrative vertical transistor structure with the tunnel barrier, according to one example of principles described herein.

FIG. 5 is a diagram showing an illustrative vertical transistor structure with a tunnel barrier. According to the present example, the vertical transistor structure 500 includes an elongated semiconductor structure 510 such as a nanowire. Formed within the elongated semiconductor structure 510 are a first source/drain region 502, a channel region 512, and a second source/drain region 504. Additionally, a tunnel barrier 506 is formed within the elongated semiconductor structure 510. Similar to the tunnel barriers described above, the tunnel barrier 506 exhibits characteristics that affect energy bands of the transistor device. Specifically, the conduction band and the valence band energy levels are different than those of the channel. In some examples, the bandgap in the tunnel barrier 506 is larger than the bandgap of the channel region 512. This helps to suppress leakage current in the off state.

The vertical transistor structure 500 also includes a gate 508. In some examples, the gate may be formed on a single side of the elongated semiconductor structure 510. In some examples, the gate 508 may be positioned on more than one side of the elongated semiconductor structure 510. In some examples, the gate 508 may be wrapped all the way around the elongated semiconductor structure 510. The gate 508 is positioned such that it covers the tunnel barrier 506. In some examples, however, the tunnel barrier 506 may extend slightly beyond the gate 508. In some examples, the gate may extend slightly beyond the tunnel barrier 506.

Figure 6A:
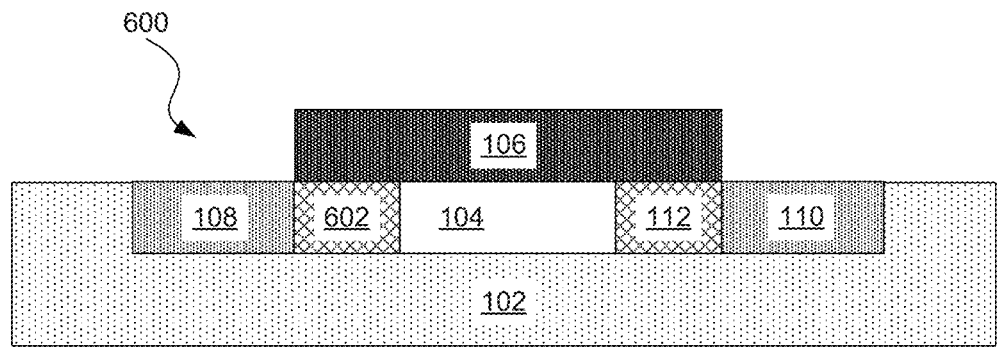
FIG. 6A is a diagram showing illustrative transistor device having two tunnel barriers, according to one example of principles described herein.

FIG. 6A is a diagram showing illustrative transistor device 600 having two tunnel barrier 602, 112. According to the present example, a second tunnel barrier 602 is positioned between the channel 104 and the first source/drain region 108. In some examples, the second tunnel barrier 602 may have similar characteristics to those of the first tunnel barrier 112. For example, the second tunnel barrier 602 may affect the bandgap of the transistor device 600. Specifically, the tunnel barrier 602 has different energy levels in the conduction band and valence band than those of the channel 104. The tunnel barrier 602 is positioned beneath the gate 106 such that the edge of the tunnel barrier 602 is substantially aligned with the edge of the gate 106. In some examples, however, the tunnel barrier 602 may extend beyond the gate 106. In some examples, the gate 106 may extend beyond the tunnel barrier 602.

Figure 6B:
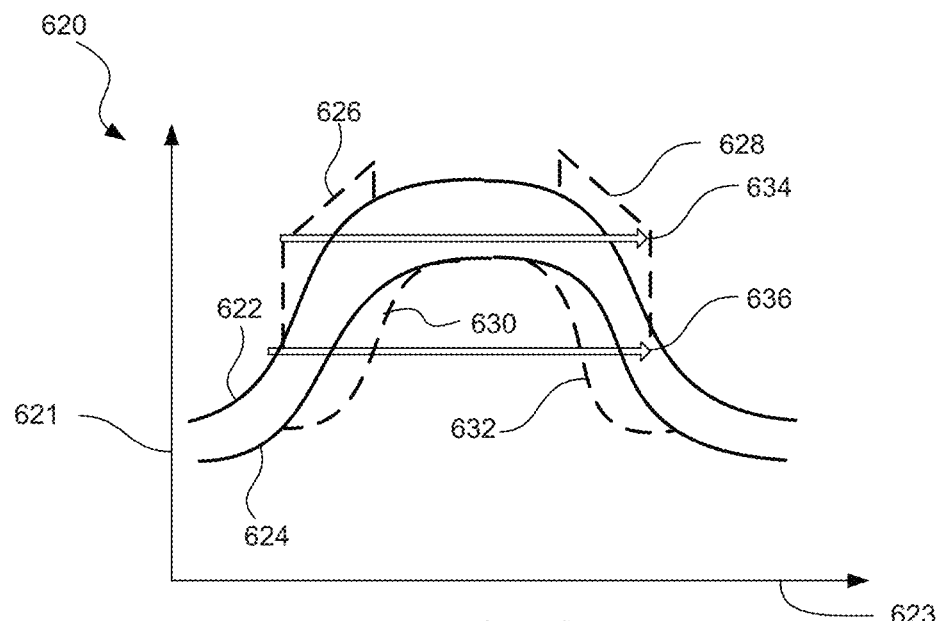
FIG. 6B is a graph showing an illustrative off-state bandgap in a transistor device having two tunnel barriers, according to one example of principles described herein.

FIG. 6B is a graph 620 showing an illustrative off-state bandgap in an NMOS transistor device having two tunnel barriers. According to the present example, the graph 620 shows the conduction band 622 and the valence band 624 of a transistor device (e.g., 600, FIG. 6A). The horizontal axis 623 of the graph 620 represents position across the first source/drain region 608, the channel 104, the tunnel barriers 602, 112, and the second source/drain region 110. The vertical axis 621 of the graph 200 represents energy levels.

The first tunnel barrier 602 affects the conduction band 622 by producing a bump 626 and affects the valence band 624 by producing a depression 630. Similarly, the second tunnel barrier 112 affects the conduction band 622 by producing a bump 628 and affects the valence band 624 by producing a depression 632. The bumps 626, 628 help reduce direct source-to-drain tunneling 634 while having a minimal effect on the on-state current flowing within the conduction band 622. The depressions 630, 632 help reduce band-to-band tunneling 636 while having minimal effect on the on-state current, as the on-state current flows in the conduction band for an NMOS transistor. In some examples, the tunnel barriers 602, 112, may be such that only the bumps 626, 628 in the conduction band 622 are present or that only the depressions 630, 632 in the valence band 624 are present.

Figure 7:
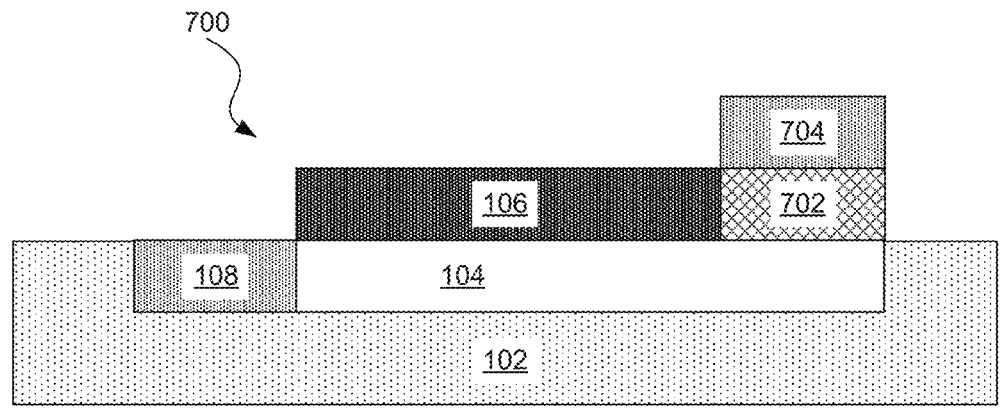
FIG. 7 is a diagram showing an illustrative transistor device having a tunnel barrier on top of the channel, according to one example of principles described herein.

FIG. 7 is a diagram showing an illustrative transistor device 700 having a tunnel barrier 702 on top of the channel 104. In the present example, the tunnel barrier 702 is formed on the channel 104 such that the bottom of the tunnel barrier 702 is substantially coplanar with the bottom of the gate 106. In the present example, tunnel barrier 702 has a similar height to that of the gate 106. In some examples, however, the tunnel barrier 702 may have a different height than the gate 106. In the present example, a second source/drain region 704 is formed on top of the tunnel barrier 702. Thus, instead of the second source/drain region 704 being substantially coplanar with the channel 104, the second source/drain region 704 is formed on top of the tunnel barrier 704 as illustrated. Other structures, in which the tunnel barrier is positioned between the channel and a source/drain region, are contemplated as well.

Figure 8:
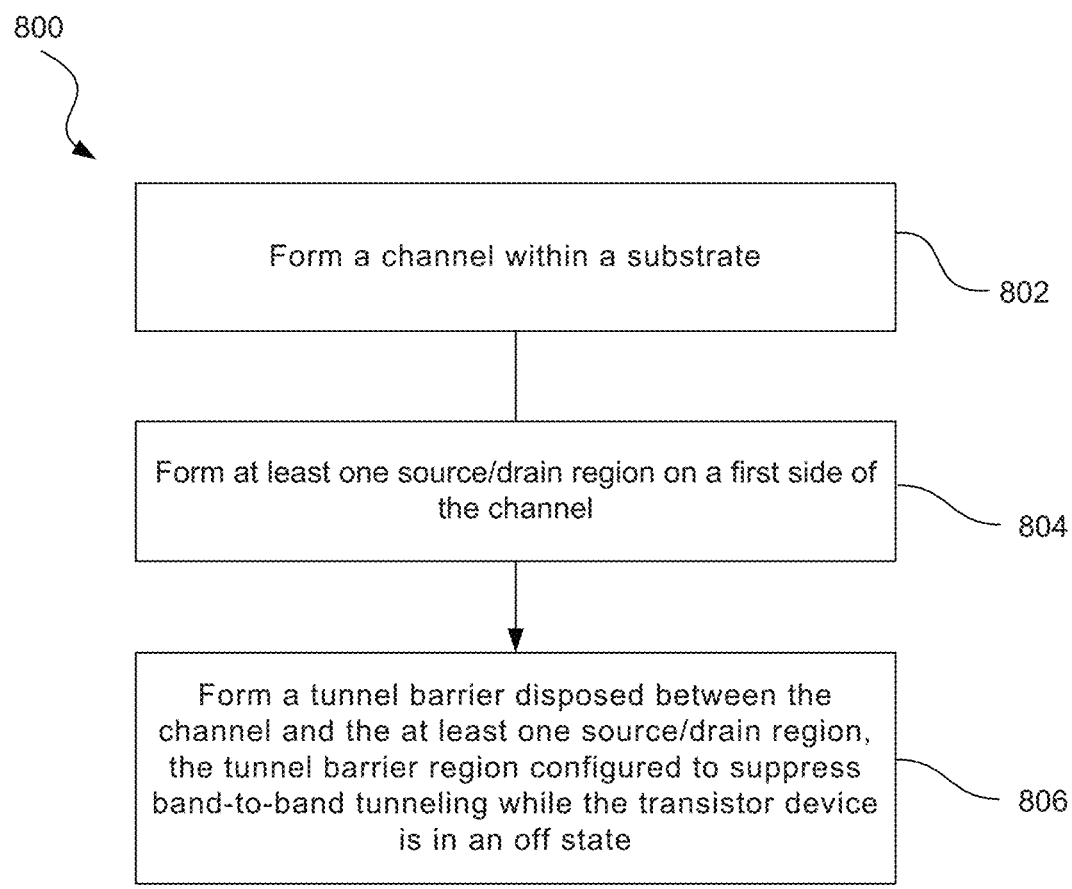
FIG. 8 is a flowchart showing an illustrative method for forming a transistor device with a tunnel barrier, according to one example of principles described herein.

FIG. 8 is a flowchart showing an illustrative method 800 for forming a transistor device with a tunnel barrier. According to the present example, the method 800 includes a step 802 for forming a channel within a substrate. The channel may be formed in a variety of ways. For example, in the case of the planar transistor device, the channel may be formed by doping a region of the substrate with the appropriate type of dopant. The appropriate type of dopant depends on the type of transistor. Specifically, for an N-type transistor, the channel is doped with the P-type dopant. For a P-type transistor, the channel is doped with an N-type dopant. In the case of a finFET (fin Field Effect Transistor), the channel is formed as a fin structure. In the case of a nanowire transistor, the channel is formed as part of the nanowire structure.

The method 800 further includes a step 804 for forming at least one source/drain region on a first side of the channel. The source/drain region may be formed in a variety of ways. For example, the source/drain region may be formed by doping the substrate with the appropriate type of dopant. For an N-type transistor, the source/drain region is doped with an N-type dopant. For a P-type transistor, the source estrogens doped with a P-type dopant. In some examples, the source/drain region may be formed using an epitaxial process. For example, the region where the source/drain region is to be formed can be removed using a removal process such as an etching process. The source/drain region can then be epitaxial grown within the trench formed by the removal process. In some examples, the source/drainage and can be doped in-situ.

The method 800 further includes a step 806 forming a tunnel barrier disposed between the channel and the source/drain region. The tunnel barrier is adapted to suppress band-to-band tunneling transistor devices in an off state. In one example, the energy levels of the conduction band and valence band within the tunnel barrier are different than that of the channel. In some examples, the tunnel barrier has a larger bandgap than that of the channel. The larger bandgap may be a result of the material used to form the tunnel barrier compared to the material used to form the channel. For example, the tunnel barrier may be made of InGaAs while the channel may be made of InAs. In addition, the tunnel barrier may be doped with a higher doping concentration than that of the adjacent source/drain region. The larger bandgap may also help suppress other forms of leakage current such as resonant tunneling and direct source to drain tunneling.

Figure 9:
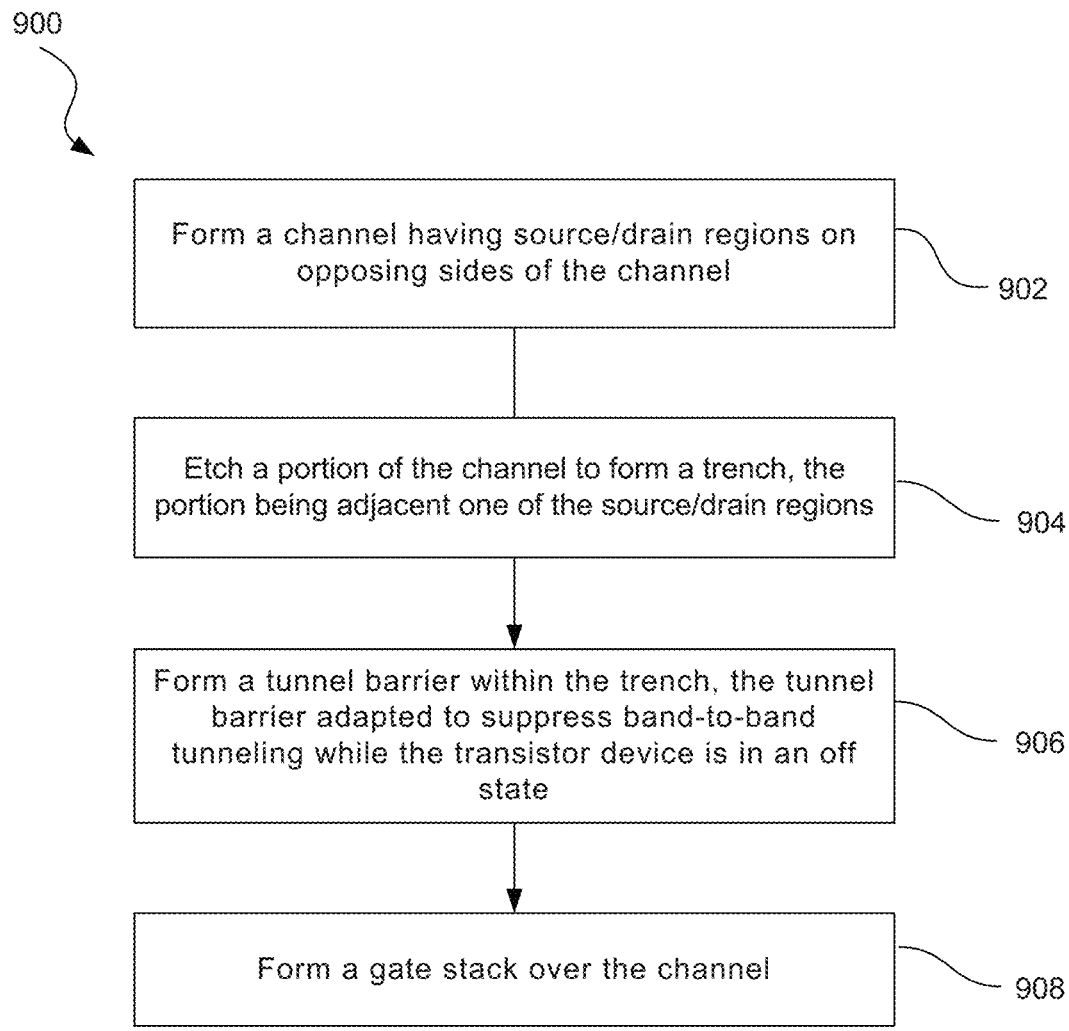
FIG. 9 is a flowchart showing an illustrative method for forming a tunnel barrier by replacement of a portion of the channel, according to one example of principles described herein.

FIG. 9 is a flowchart showing an illustrative method 900 for forming a tunnel barrier by replacement of a portion of the channel. According to the present example, method 900 includes a step 902 for forming a channel having source/drain regions on opposing sides of the channel. The channel may be formed in a variety of ways as described above.

The method 900 further includes a step 904 for etching a portion of the channel to form a trench. The trench is formed adjacent to one of the source/drain regions. The trench may be formed using a removal process such as an etching process. For example, photolithographic techniques may be used to pattern a photoresist and expose the underlying substrate to the removal process.

The method 900 further includes a step 906 for forming a tunnel barrier within the trench. The tunnel barrier is adapted to suppress band-to-band tunneling while the transistor devices in an off state. In one example, the energy levels of the conduction band and valence band within the tunnel barrier are different than that of the channel. In some examples, the tunnel barrier has a larger bandgap than that of the channel. The larger bandgap may be a result of the material used to form the tunnel barrier compared to the material used to form the channel. For example, the tunnel barrier may be made of InGaAs while the channel may be made of InAs. In addition, the tunnel barrier may be doped with a higher doping concentration than that of the adjacent source/drain region. The larger bandgap may also help suppress other forms of leakage current such as resonant tunneling and direct source to drain tunneling.

The method 900 further includes a step 908 for forming a gate stack over the channel. The gate stack may include a variety of layers including a high-k dielectric material and a variety of metal layers to form a metal gate. The gate stack may also cover the tunnel barrier.

Figure 10:
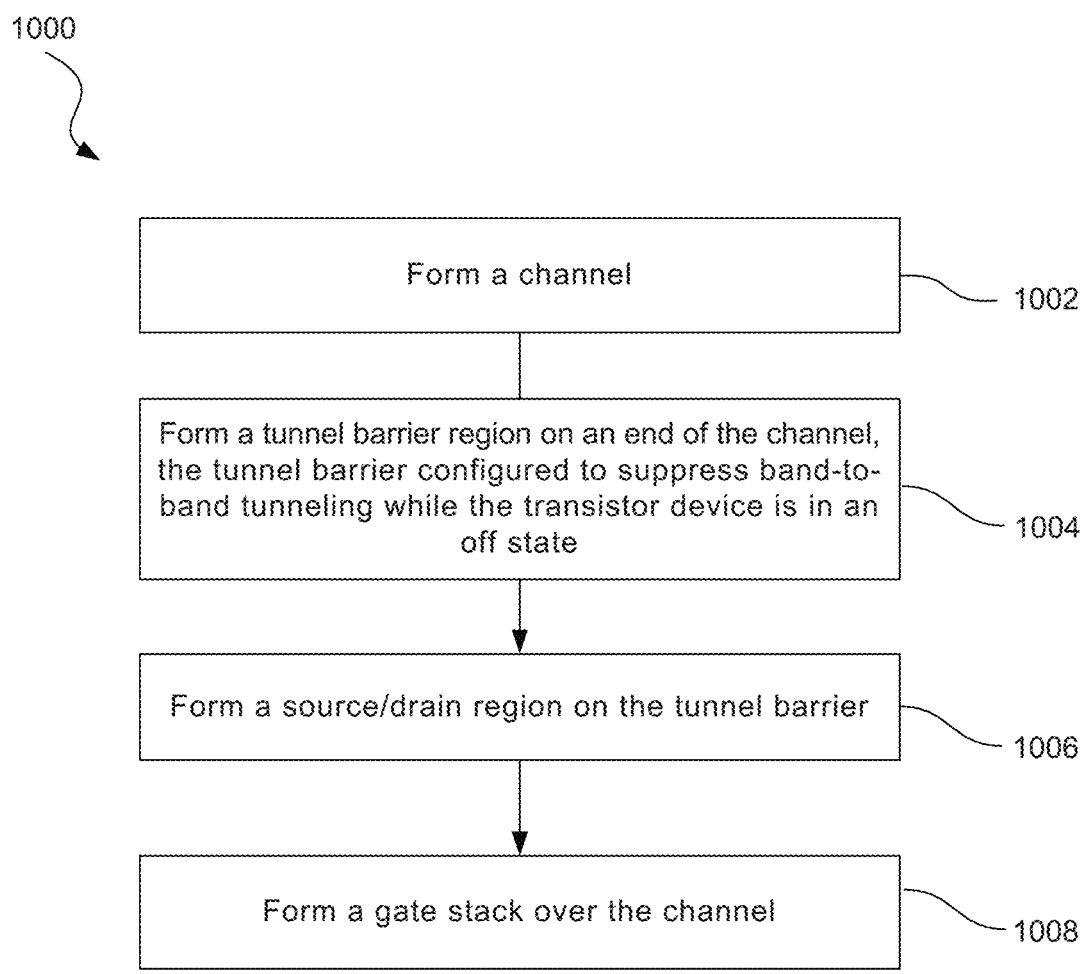
FIG. 10 is a flowchart showing an illustrative method for forming a tunnel barrier adjacent the gate stack, according to one example of principles described herein.

FIG. 10 is a flowchart showing an illustrative method 1000 for forming a tunnel barrier adjacent the gate stack. According to the present example, the method 1000 includes a step 1002 for forming a channel. The channel may be formed in a variety of ways as described above.

The method 1000 further includes a step 1004 for forming a tunnel barrier on an end of the channel. The tunnel barrier may be formed in a variety of manners. In one example, the tunnel barrier is formed through an epitaxial process. An epitaxial process involves growth of a crystal material on a crystal substrate. In this case, the crystal substrate may be the channel and the crystal material may be the tunnel barrier material. In one example the channel may be made of InAs and the tunnel barrier may be made of InGaAs. Other methods for forming the tunnel barrier are contemplated as well. Furthermore, the tunnel barrier is adapted to suppress band-to-band tunneling while the transistor devices in an off state. Specifically, the tunnel barrier has a larger bandgap than that of the channel. The larger bandgap may be a result of the material used to form the tunnel barrier compared to the material used to form the channel. For example, the tunnel barrier may be made of InGaAs while the channel may be made of InAs. In addition, the tunnel barrier may be doped with a higher doping concentration than that of the adjacent source/drain region. The larger bandgap may also help suppress other forms of leakage current such as resonant tunneling and direct source to drain tunneling.

The method 1000 further includes a step 1006 four forming a source/drain region on the tunnel barrier. In some examples, the source/drain region may also be formed using an epitaxial growth process. The source/drain region may have a different material than the tunnel barrier. The source/drain region is doped according to the type of transistor device.

The method 1000 further includes a step 1008 for forming a gate stack over the channel. The gate stack may include a variety of layers including a high-k dielectric material and a variety of metal layers to form a metal gate. The gate stack may be formed adjacent the tunnel barrier such that the bottom of the gate stack is substantially coplanar with the bottom of the tunnel barrier.

Figure 11:
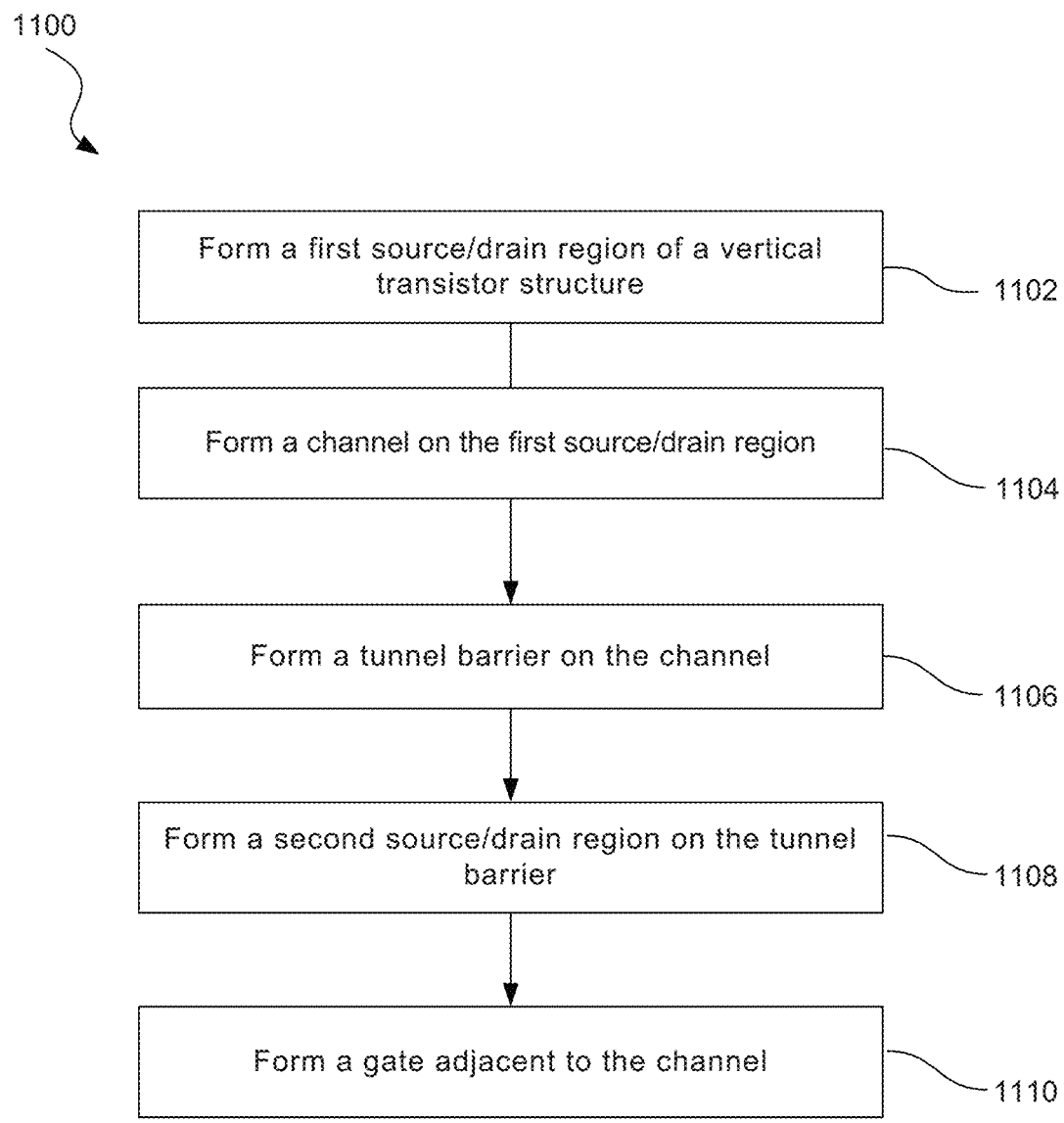
FIG. 11 is a flowchart showing an illustrative method for forming a vertical transistor structure with a tunnel barrier, according to one example of principles described herein.

FIG. 11 is a flowchart showing an illustrative method 1100 for forming a vertical transistor structure with a tunnel barrier. According to the present example, the method 1100 includes a step 1102 for forming a first source/drain region of vertical transistor structure. The source/drain region may be formed using an epitaxial growth process.

The method 1100 further includes a step 1104 forming a channel on the first source/drain region. In some examples, the channel may have a larger height than that of the first source/drain region. The type of dopant used for the channel depends on the type of transistor. For example, an N-type transistor has a channel doped with the P-type dopant and a P-type transistor has a channel doped with an N-type dopant.

The method 1100 further includes a step 1106 for forming a tunnel barrier on the channel. The tunnel barrier may also be formed using an epitaxial growth process. The tunnel barrier is adapted to suppress band-to-band tunneling while the transistor devices in an off state. In one example, the energy levels of the conduction band and valence band within the tunnel barrier are different than that of the channel. In some examples, the tunnel barrier has a larger bandgap than that of the channel. The larger bandgap may be a result of the material used to form the tunnel barrier compared to the material used to form the channel. For example, the tunnel barrier may be made of InGaAs while the channel may be made of InAs. In addition, the tunnel barrier may be doped with a higher doping concentration than that of the adjacent source/drain region. The larger bandgap may also help suppress other forms of leakage current such as resonant tunneling and direct source to drain tunneling.

The method 1100 further includes a step 1108 performing second source/drain region on the tunnel barrier. The second source/drain region may have similar characteristics to that of the first source/drain region. The second source/drain region may also be formed using an epitaxial process.

The method 1100 further includes a step 1110 for forming a gate adjacent to the channel. The gate may be formed in a variety of manners. In some cases, the gate may wrap all the way around the vertical transistor structure. The gate may be formed such that it is adjacent to the channel and the tunnel barrier as illustrated in FIG. 5.

Figure 12:
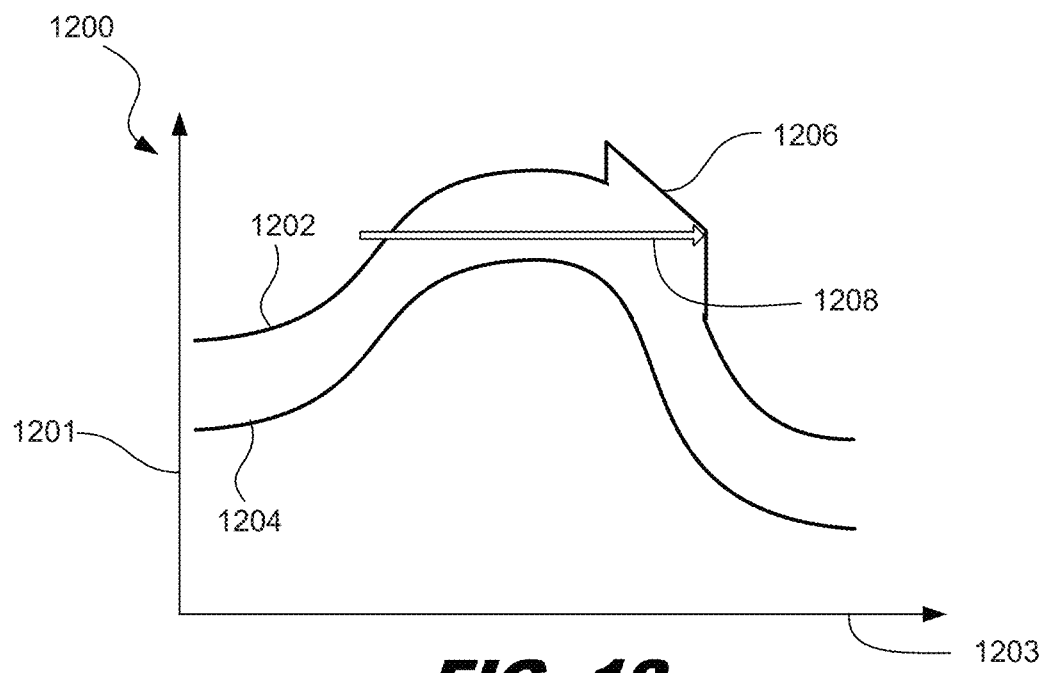
FIG. 12 is a diagram showing an illustrative off-state bandgap in a transistor having a tunnel barrier adapted to limit direct source-to-drain tunneling, according to one example of principles described herein.

FIG. 12 is a graph 1200 showing an illustrative off-state bandgap in an NMOS transistor having a tunnel barrier adapted to limit direct source-to-drain tunneling. According to the present example, the graph 1200 shows the conduction band 1202 and the valence band 1204 of a transistor device (e.g., 100, FIG. 1). The horizontal axis 1203 of the graph 1200 represents position across the first source/drain region 108, the channel 104, the tunnel barrier 112, and the second source/drain region 110 as illustrated in FIG. 1. The vertical axis 1201 of the graph 1200 represents energy levels. In the present example, the tunnel barrier affects the conduction band 1202 by producing a bump 1206. The bump 1206 helps reduce direct source-to-drain tunneling 1208 while having a minimal effect on the on-state current flowing within the conduction band 1202.

Figure 13:
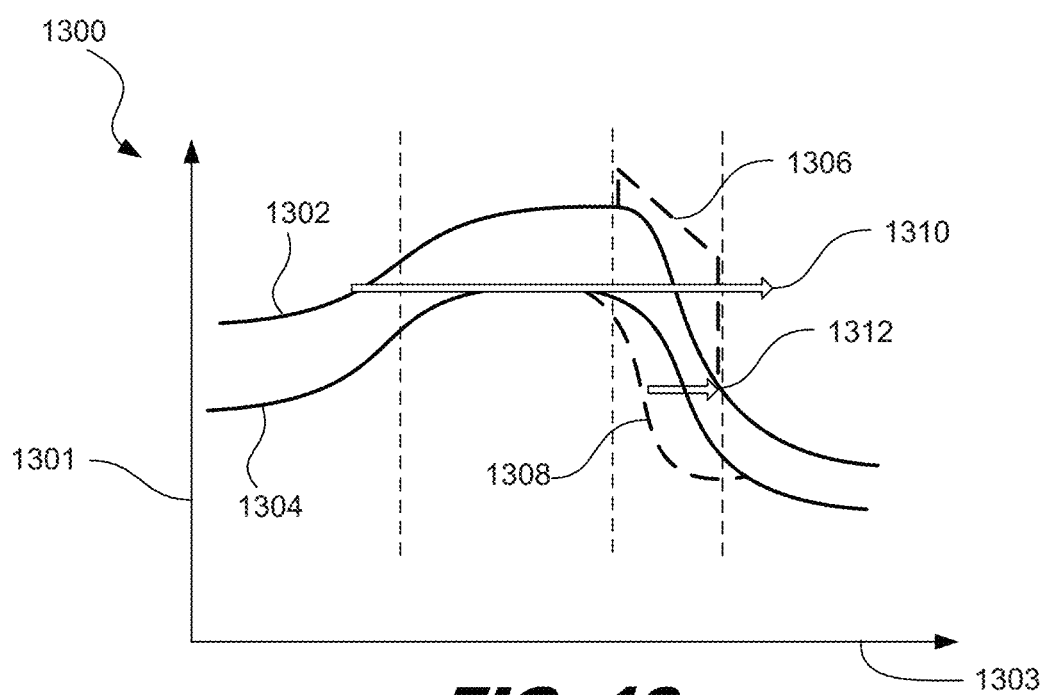
FIG. 13 is a diagram showing an illustrative off-state bandgap in a transistor having a tunnel barrier adapted to limit both double resonant band-to-band tunneling and band-to-band tunneling, according to one example of principles described herein.

FIG. 13 is a graph 1300 showing an illustrative off-state bandgap in a transistor having a tunnel barrier adapted to limit both double resonant band-to-band-tunneling (DRBTBT) and band-to-band tunneling. As shown by the arrow 1310 in FIG. 13, DRBTBT is enabled when the gate voltage is such that the valence band in the channel is aligned in energy with the conduction band in the source, creating a leakage path for electrons from the source to tunnel to the valence band in the channel and subsequently to the conduction band in the drain. According to the present example, the graph 1300 shows the conduction band 1302 and the valence band 1304 of a transistor device (e.g., 100, FIG. 1). The horizontal axis 1303 of the graph 1300 represents position across the first source/drain region 108, the channel 104, the tunnel barrier 112, and the second source/drain region 110 as illustrated in FIG. 1. The vertical axis 1301 of the graph 1300 represents energy levels. In the present example, the tunnel barrier affects the conduction band 1302 by producing a bump 1306. Additionally, the tunnel barrier affects the valence band 1304 by producing a depression 1308. The bump 1306 helps reduce DRBTBT 1310 while having a minimal effect on the on-state current that flows within the conduction band 1302. The depression 1308 helps reduce band-to-band tunneling 1312 while having a minimal effect on the on-state current that flows within the conduction band 1302. Both the bump 1306 and the depression 1308 can be used in combination to limit off-state leakage current.

The examples described above in FIGS. 2A, 2B, 3A, 3B, 6B, 12, and 13 relate to NMOS transistors. Similar principles may be applied to PMOS transistors. In PMOS transistors, electric current is caused by the motion of holes that move through the valence band. Thus, bumps in the conduction band may have minimal effect on the current flowing in the valence band. Additionally, depressions in the valence band can be designed to have little effect on the on-state current while limiting off-state leakage current.

Figure 14:
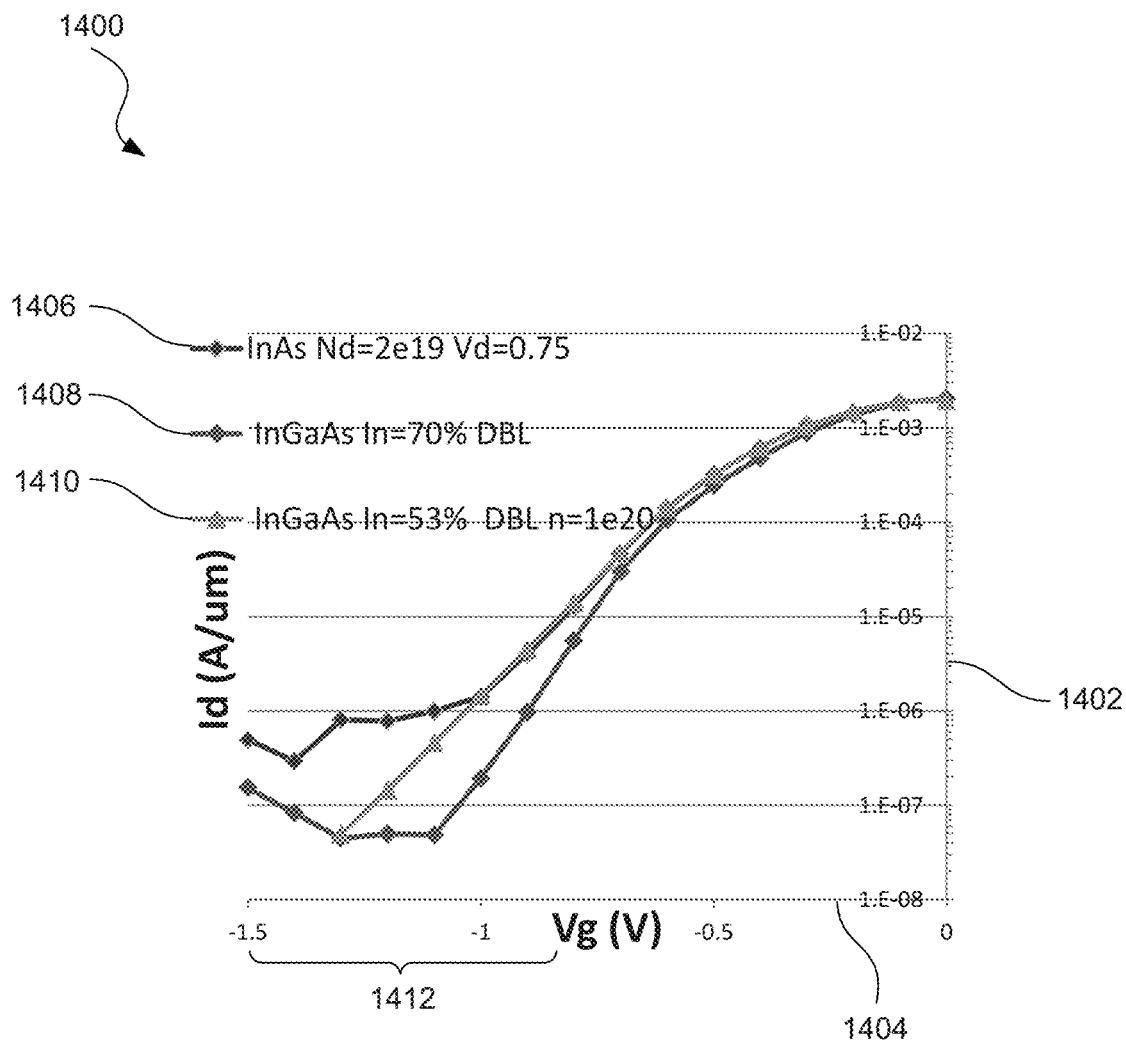
FIG. 14 is a graph showing simulated results comparing a device without a tunnel barrier and devices with a tunnel barrier, according to one example of principles described herein.

FIG. 14 is a graph 1400 showing simulated results using atomistic tight binding quantum transport simulations comparing a device without a tunnel barrier and devices with a tunnel barrier. In the present example, the vertical axis 1402 represents electric current and the horizontal axis 1404 represents voltage. The first line 1406 represents the IV curve for a device without a tunnel barrier. The second line 1408 represents the IV curve for a device having a tunnel barrier that includes InGaAs in which the atomic percentage of indium is 70%. The third line 1410 represents the IV curve for a device having a tunnel barrier made of InGaAs in which the atomic percentage of indium is 53% and using a high N-type doping of $10^{20}$ cm$^{-3}$ in the barrier to create a valence band (VB) barrier (depression). Both 1408 and 1410 feature mixed conduction band/valence band barriers (Band structure like in FIG. 13). 1410 is closer to a VB barrier case (FIGS. 2A and 2B), while 1408 case is closer to a conduction band (CB) barrier case (FIGS. 3A and 3B). As can be seen, the devices represented by lines 1408 and 1410 have a substantially lower current level in the region 1412. This is a result of the suppressed band-to-band tunneling current through use of the tunnel barrier. For the 1408 case, direct source-to-drain tunneling is also significantly reduced.

Figure 15:
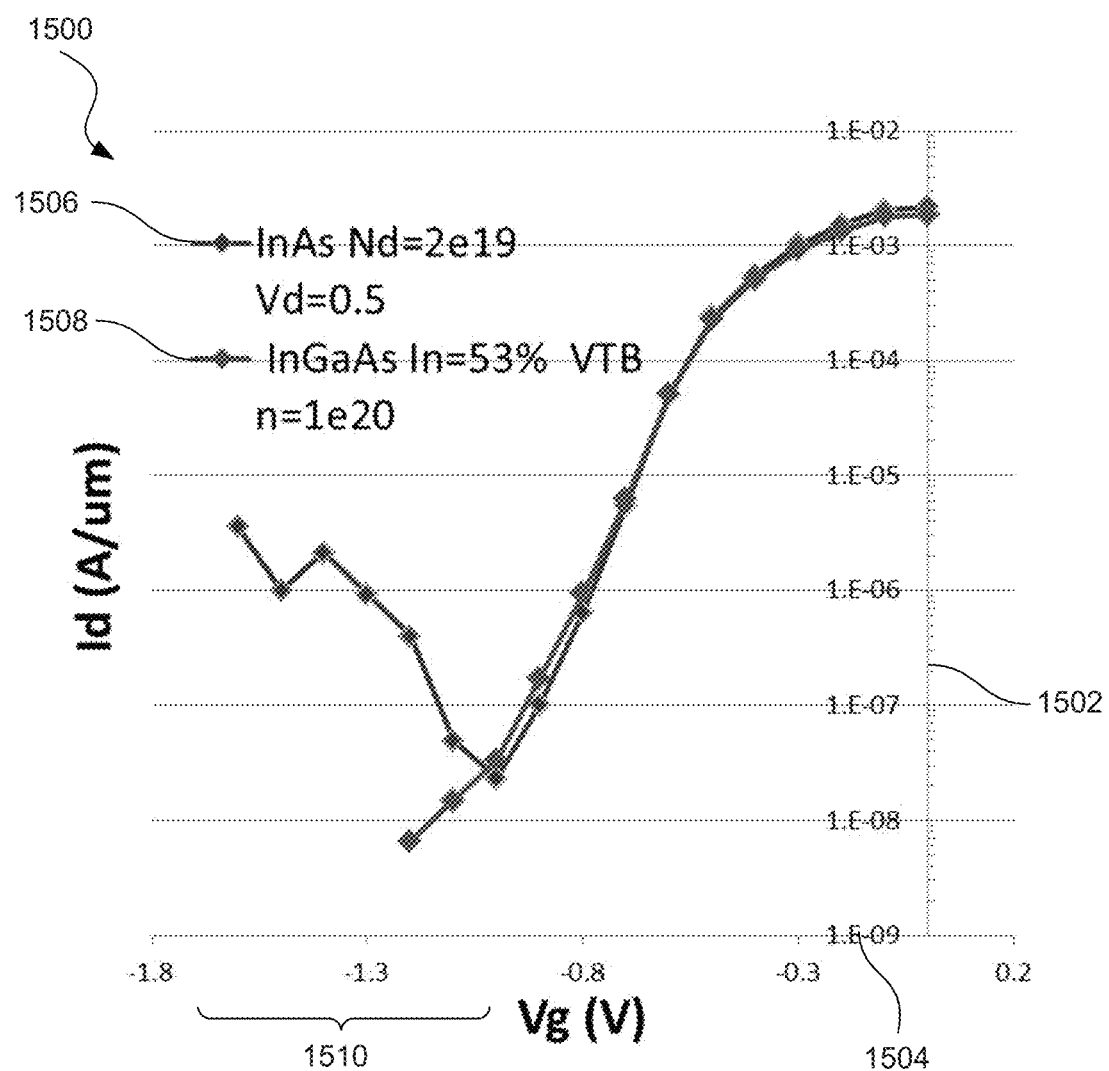
FIG. 15 is a graph showing simulated results comparing a device without a tunnel barrier and a device with a tunnel barrier that is adapted to reduce resonant tunneling, according to one example of principles described herein.

FIG. 15 is a graph 1500 showing simulated results comparing a device without a tunnel barrier and a device with a tunnel barrier that is adapted to reduce double resonant band-to-band tunneling current. In the present example, the vertical axis 1502 represents electric current and the horizontal axis 1504 represents voltage. The first line 1506 represents the IV curve of a device without a tunnel barrier. The second line 1508 represents the IV curve of a device having a tunnel barrier adapted to reduce resonant tunneling (i.e. double resonant band-to-band tunneling current). As can be seen, the device represented by line 1508 has a substantially reduced current level in the region 1510. This is a result of the suppressed resonant tunneling resulting from use of principles described above.

Figure 16:
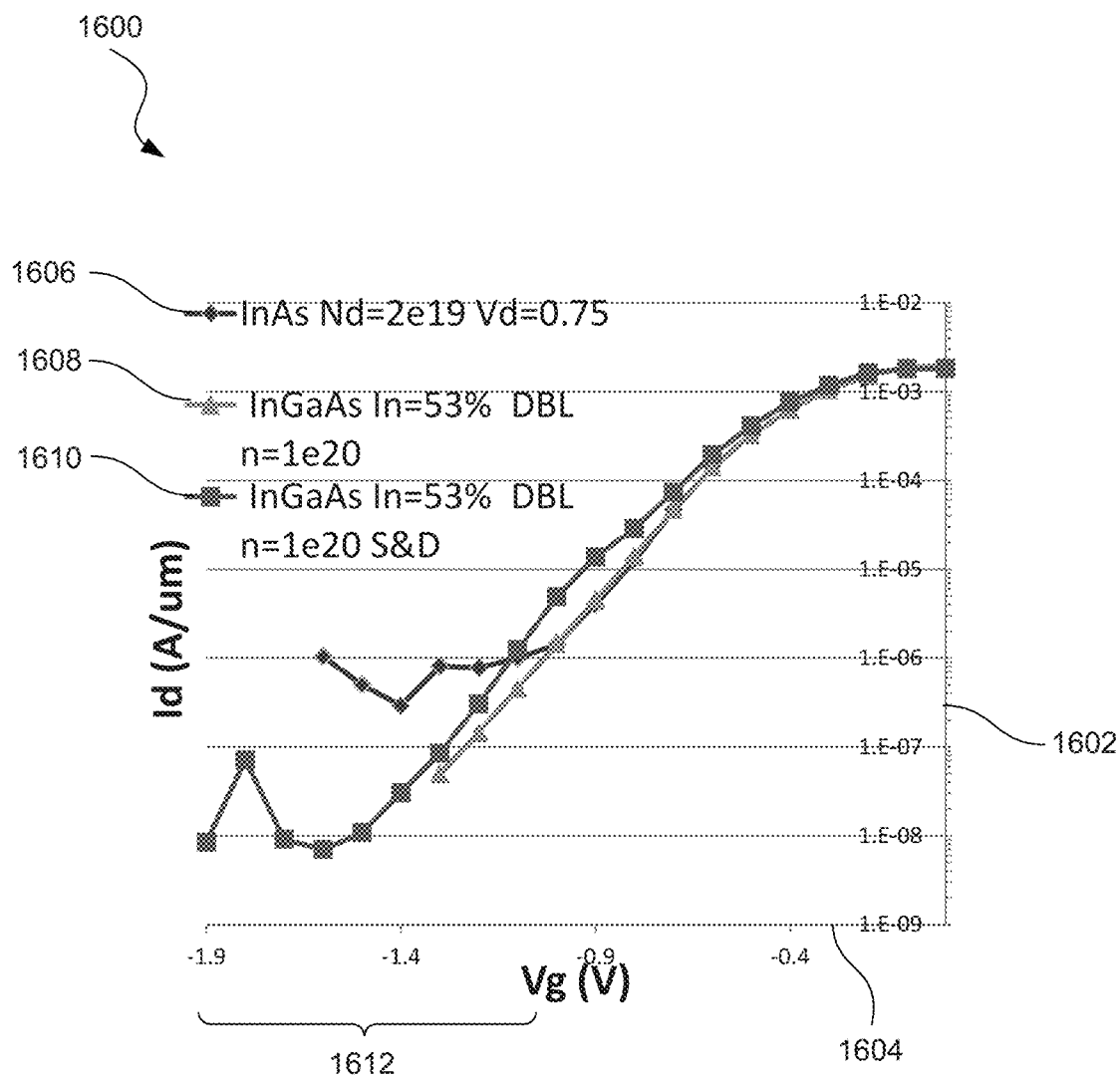
FIG. 16 is a graph showing simulated results comparing a device without a tunnel barrier and devices with one and two tunnel barriers, according to one example of principles described herein.

FIG. 16 is a graph 1600 showing simulated results comparing a device without a tunnel barrier and devices with tunnel barriers, according to one example of principles described herein. In the present example, the vertical axis 1602 represents electric current and the horizontal axis 1604 represents voltage. The first line 1606 represents the IV curve of a device without a tunnel barrier. The second line 1608 represents the IV curve of a device having a single tunnel barrier. The third line 1610 represents the IV curve of a device having two tunnel barriers as illustrated in FIG. 6A. As can be seen the devices represented by lines 1608 and 1610 have a reduced current level in the region 1612. This is a result of use of the tunnel barriers that are adapted to suppress leakage current.

Use of principles described herein may provide a variety of advantages. Specifically high mobility materials may be used for the channel of transistor devices while also having a relatively low off state current. This may be particularly beneficial for circuits that employ a variety of power settings. Specifically, industry standards specify minimum leakage current for high-powered devices, low operating power devices, and low standby power devices. But, sometimes different circuits that utilize different power settings may be integrated onto the same chip or same wafer. Typically, only high-powered devices, which have a higher minimum leakage current requirement, can utilize high mobility materials. But, by suppressing the leakage current using techniques described herein, high mobility materials may be used for circuits that have other power settings such as low operating power and low standby power. Thus, manufacturing processes may use the same type of material for each of the transistors on the wafer. This improves cost efficiency of manufacturing such circuits.

According to one example, a transistor device includes a channel, a first source/drain region positioned on a first side of the channel, a second source/drain region positioned on a second side of the channel opposite the first side of the channel, and a tunnel barrier disposed between the channel and the first source/drain region, the tunnel barrier adapted to suppress band-to-band tunneling while the transistor device is in an off state.

According to one example, a semiconductor device includes a channel having a first bandgap, a gate positioned adjacent to the channel, a first source/drain region positioned on a first side of the channel, a second source/drain region positioned on a second side of the channel opposite the first side of the channel, and a tunnel barrier disposed between the channel and the first source/drain region, the tunnel barrier having a second bandgap that is greater than the first bandgap.

According to one example, a method includes forming a channel, forming a first source/drain region positioned on a first side of the channel, forming a second source/drain region positioned on a second side of the channel opposite the first side of the channel, and forming a tunnel barrier disposed between the channel and the first source/drain region, the tunnel barrier adapted to suppress band-to-band tunneling while the transistor device is in an off state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor device comprising:
    a channel that includes a first semiconductor material doped with a first doping concentration of a first type dopant;
    a gate positioned adjacent to the channel;
    a first source/drain region positioned on a first side of the channel;
    a second source/drain region positioned on a second side of the channel opposite the first side of the channel, wherein the first source/drain and the second source/drain are doped with a second type dopant, wherein the second type dopant is different than the first type dopant; and
    a tunnel barrier disposed between the channel and the first source/drain region, wherein the tunnel barrier includes a second semiconductor material that is different than the first semiconductor material, wherein the second semiconductor material is doped with a second doping concentration of the second type dopant, wherein the absolute value of the second doping concentration is higher than the absolute value of the first doping concentration, wherein the tunnel barrier being positioned directly above the channel, directly below and directly contacting the first source/drain region, and adjacent the gate such that a bottom side of the tunnel barrier is substantially coplanar with a bottom side of the gate and that a top side of the tunnel barrier is substantially coplanar with a top side of the gate, the top side of the tunnel barrier being opposite the bottom side of the tunnel barrier, the tunnel barrier configured for suppressing band-to-band tunneling while the transistor device is in an off state, wherein the second doping concentration of the tunnel barrier is higher than a third doping concentration of the first source/drain region.

2. The transistor device of claim 1, wherein the channel comprises a first bandgap and the tunnel barrier comprises a second bandgap that is greater than the first bandgap.

3. The transistor device of claim 1, wherein the channel comprises silicon germanium (SiGe).

4. The transistor device of claim 1, wherein the channel comprises indium arsenic (InAs) and the tunnel barrier comprises indium gallium arsenic (InGaAs).

5. The transistor device of claim 1, wherein the channel and tunnel barrier material respectively comprise one of: silicon and silicon germanium or indium phosphorous, silicon germanium and germanium, silicon and germanium, indium arsenic and indium arsenic antimony, and indium arsenic and indium antimony.

6. The transistor device of claim 1, wherein the tunnel barrier comprises a different material than the channel and the first source/drain region.

7. The transistor device of claim 1, wherein the tunnel barrier comprises a semiconductor material having a greater effective mass than a semiconductor material that forms the channel and a semiconductor material that forms the first source/drain region.

8. The device of claim 1, wherein the tunnel barrier comprises indium gallium arsenide (InGaAs) having 53% atomic percentage of indium.

9. The device of claim 1, wherein the tunnel barrier comprises an N-type doping concentration of $10^{20}$ cm$^{-3}$.

10. The device of claim 1, wherein the tunnel barrier is configured to drop a valence band within the tunnel barrier by a range of about 0.1-0.3 electron volts.

11. The device of claim 1, wherein the tunnel barrier comprises indium gallium arsenide (InGaAs) having 70% atomic percentage of indium.

12. The device of claim 1, wherein the tunnel barrier is configured to raise a conduction band within the tunnel barrier by a range of about 0.1-0.3 electron volts.

13. A semiconductor device comprising a field effect transistor, the field effect transistor comprising:
    a channel having a first bandgap, the channel comprising a first semiconductor material doped with a first doping concentration of an n-type dopant;
    a gate positioned adjacent to the channel;
    a first source/drain region positioned on a first side of the channel;
    a second source/drain region positioned on a second side of the channel opposite the first side of the channel, wherein the first source/drain and the second source/drain are doped with a p-type dopant; and
    a tunnel barrier disposed between the channel and the first source/drain region, wherein the tunnel barrier includes a second semiconductor material that is different than the first semiconductor material, wherein the second semiconductor material is doped with a second doping concentration of p type dopant, the tunnel barrier being positioned directly above the channel, directly below and directly contacting the first source/drain region, and adjacent the gate such that a bottom side of the tunnel barrier is substantially coplanar with a bottom side of the gate and that a top side of the tunnel barrier is substantially coplanar with a top side of the gate, the top side of the tunnel barrier being opposite the bottom side of the tunnel barrier, a sidewall of the tunnel barrier is substantially vertically aligned in a straight line with a sidewall of the channel, the sidewall of the tunnel barrier being perpendicular to the bottom side of the tunnel barrier, wherein the second doping concentration of the tunnel barrier has a higher doping concentration than a third doping concentration of the first source/drain region.

14. The semiconductor device of claim 13, wherein the channel comprises indium arsenic (InAs) and the tunnel barrier comprises indium gallium arsenic (InGaAs).

15. The semiconductor device of claim 13, wherein the channel comprises silicon germanium (SiGe).

16. The semiconductor device of claim 13, wherein the channel and tunnel barrier material respectively comprise one of: silicon and silicon germanium or indium phosphorous, silicon germanium and germanium, silicon and germanium, indium arsenic and indium arsenic antimony, and indium arsenic and indium antimony.

17. The semiconductor device of claim 13, wherein the tunnel barrier comprises a different material than the channel and the first source/drain region.

18. A method comprising:
forming a channel for a transistor device, the channel including a first semiconductor material doped with a first doping concentration of a first type dopant;
forming a gate positioned adjacent to the channel;
forming a first source/drain region positioned on a first side of the channel;
forming a second source/drain region positioned on a second side of the channel opposite the first side of the channel, wherein the first source/drain and the second source/drain are doped with a second type dopant, wherein the second type dopant is different than the first type dopant; and
epitaxially forming a tunnel barrier disposed between the channel and the first source/drain region, wherein the tunnel barrier includes a second semiconductor material that is different than the first semiconductor material, wherein the second semiconductor material is doped with a second doping concentration of the second type dopant, wherein the numerical value of the second doping concentration is higher than the numerical value of the first doping concentration, the tunnel barrier being positioned directly above the channel, directly below and directly contacting the first source/drain region, and adjacent the gate such that a bottom side of the tunnel barrier is substantially coplanar with a bottom side of the gate and that a top side of the tunnel barrier is substantially coplanar with a top side of the gate, the top side of the tunnel barrier being opposite the bottom side of the tunnel barrier, the tunnel barrier configured for suppressing band-to-band tunneling while the transistor device is in an off state, the tunnel barrier having a higher doping concentration than a doping concentration of the first source/drain region.

19. The method of claim 18, wherein:
the forming of the channel includes the channel of a first semiconductor material having a first bandgap; and
the forming of the tunnel barrier includes forming the tunnel barrier of a second semiconductor material having a second bandgap different from the first bandgap.

20. The method of claim 19, wherein the first semiconductor material comprises indium arsenic (InAs) and the second semiconductor material comprises indium gallium arsenic (InGaAs).

* * * * *